US008072227B2

(12) United States Patent
Shimazawa

(10) Patent No.: US 8,072,227 B2
(45) Date of Patent: Dec. 6, 2011

(54) METHOD FOR MANUFACTURING TACTILE-SENSITIVE MATERIAL UTILIZING MICROCOILS

(75) Inventor: Koji Shimazawa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 12/948,426

(22) Filed: Nov. 17, 2010

(65) Prior Publication Data

US 2011/0167616 A1 Jul. 14, 2011

Related U.S. Application Data

(62) Division of application No. 11/839,840, filed on Aug. 16, 2007, now Pat. No. 7,868,628.

(51) Int. Cl.
*G01R 27/28* (2006.01)
*G01B 7/14* (2006.01)

(52) U.S. Cl. .................... 324/655; 324/652; 324/207.15

(58) Field of Classification Search .................. 324/652, 324/655, 207.15

See application file for complete search history.

(56) References Cited

U.S. PATENT DOCUMENTS

| | | | | |
|---|---|---|---|---|
| 4,950,987 | A | 8/1990 | Vranish et al. | |
| 4,994,738 | A | 2/1991 | Soyck et al. | |
| 6,853,182 | B2 * | 2/2005 | Faber | 324/207.15 |

FOREIGN PATENT DOCUMENTS

| | | |
|---|---|---|
| JP | A-2005-049332 | 2/2005 |
| JP | A-2005-291927 | 10/2005 |
| JP | A-2006-184098 | 7/2006 |
| JP | A-2006-321716 | 11/2006 |
| JP | A-2007-121238 | 5/2007 |

* cited by examiner

*Primary Examiner* — Amy He

(74) *Attorney, Agent, or Firm* — Oliff & Berridge, PLC

(57) ABSTRACT

Provided is a material for tactile sensor, which is easy to be formed, and in which the shape, size and orientation of coils dispersed in the medium are sufficiently controlled. The tactile-sensitive material includes a medium and a plurality of micro coils dispersed in the medium and constituting a LCR resonance circuit, and wherein each of the plurality of micro coils includes at least one spiral coil portion, and coil axes of the plurality of micro coils are aligned along at least one direction or directed in at least one plane. When a tactile stress is applied to the tactile-sensitive material, the C component is varied significantly, which contributes to the improvement in sensitivity of the tactile sensor. Further, by providing a core at the coil center, the sensitivity is more improved.

7 Claims, 7 Drawing Sheets

METHOD FOR MANUFACTURING TACTILE-SENSITIVE MATERIAL UTILIZING MICROCOILS

This is a Division of application Ser. No. 11/839,840 filed Aug. 16, 2007. The disclosure of the prior application is hereby incorporated by reference herein in its entirety.

BACKGROUND OF THE INVENTION

1. Field of the Invention

The present invention relates to a material sensitive to tactile stress (a tactile-sensitive material) utilizing micro coils with a spiral shape, and further to a tactile sensor formed with the tactile-sensitive material. The present invention further relates to a manufacturing method of the tactile-sensitive material.

2. Description of the Related Art

A tactile sense, which is one of the five senses of human, is a sense to receive mechanical stimulations generated from the contact with outer objects; however being broadly interpreted, it includes a skin sensation such as pressure sense generated from the contact, tough feeling and so on.

In recent years, many researches have been made to embody the tactile sense, which has a great deal of information, as artificial sensors. Such tactile sensors could be applied to various fields such as, for example, a robot having a skin sensation comparable with or exceeding that of human.

As examples of existing and simple tactile sensors, taken are an electric capacity type sensor, a piezoelectric type sensor, and an optical type sensor. However, these sensors simply measure applied stress numerically, generally with low sensitivity, and are difficult to be miniaturized.

Whereas, currently, a tactile sensor using carbon micro coils (CMC) is proposed and gathers attention. The CMC is a coil having a coil diameter from several hundreds nanometers to several micrometers and a helical shape, and is a new material that is expected to be applied to various fields such as an electromagnetic-wave-absorbing material, a microwave-absorbing material, a bioactive agent and so on. The structure and manufacturing method of the CMC is described in detail, for example, in Japanese Patent Publication No. 2006-321716A.

The CMC has an amorphous structure of carbon and a feature with high elasticity; therefore, it easily expands and contracts in response to even minute stress. When the CMC expands or contracts, also varies inductance (L), capacitance (C) and resistance (R) that are electric properties of the CMC. As an example of utilizing the anomalous characteristics of the CMC, Japanese Patent Publication No. 2007-121238A describes that the CMC is applied to a screen for infrared emission of an electric-wave-visibility apparatus, and further, Japanese Patent Publication No. 2006-184098A describes that the CMC is applied to conductive pressure-sensitive rubber of a pressure-sensitive sensor. However, attention is especially attracted by the above-described advanced tactile sensor formed with combined materials in which CMCs are dispersed uniformly in an elastic resin, as described, for example, in Japanese Patent Publication No. 2005-49332A and Japanese Patent Publication No. 2005-291927A.

Here, FIG. 1 shows the tactile sensor utilizing the CMCs described in Japanese Patent Publication No. 2005-49332A.

In a tactile sensor 11 shown in FIG. 1, CMCs 13 are dispersed randomly in solid medium 12, and a pair of electrodes 14 is provided respectively on the upper and lower surfaces of the medium. The dispersed CMCs 13 coupled electromagnetically through the medium 12 constitute a LCR resonance circuit. When a tactile stress, which is a mechanical stimulation generated from the contact with an outer object, is applied to a part or the whole of the tactile sensor 11 under the condition that an alternate current is applied to the LCR resonance circuit through the electrodes 14, an integrated variation in the L component, the C component and the R component occurs, which causes the variation in voltage or the like of the LCR resonance circuit. Thus, the tactile stress can be sensed by detecting the variation through the electrodes 14.

Further, the forming method of the medium 12 with the dispersed CMCs 13 is disclosed as follows: First, the predetermined amount of CMC is added into a base resin of silicon, and then, a hardening agent is further added to prepare a mixture. Then, the mixture is agitated to disperse the CMCs. After that, a mold is filled with the agitated mixture; then, by hardening the mixture, the medium 12 with the dispersed CMCs 13 is obtained.

In the tactile sensor formed by using the just-described method, the CMCs have rather random orientation in the resin. That is to say, the forming method cannot provide a controlled three-dimensional orientation of the CMCs in the resin. Further, as the sensor is miniaturized toward the order of the coil length, an unintended deviation in the orientation of the CMCs inevitably occurs. Originally, it is quite different to completely randomly orient coils having shapes such as the CMC in a limited space. Such a deviation causes the variation in characteristics of the sensor, further may cause the decrease in sensitivity of the sensor in the case of its miniaturization. As the measure for this problem, Japanese Patent Publication No. 2005-49332A describes the technique in which the CMCs 13 are oriented toward the direction parallel to lines of the magnetic field which is applied to the medium 12 with the dispersed CMCs 13. However, the degree of the orientation has a certain limitation even if a magnetic field with fairly substantial intensity is applied to such a coil as the CMC.

Further, the synthesized CMCs have various shapes, various coil diameters, whole lengths and so on according to the synthesizing condition, and the synthesized batch of the CMCs has a certain distribution of them. Therefore, there are limits of desired uniformities of the shape and the size of the CMCs. Even such non-uniform CMCs are not so easy to be produced.

BRIEF SUMMARY OF THE INVENTION

Therefore, an object of the present invention is to provide a material for tactile sensor, which is easy to be formed, and in which the shape, size and orientation of coils dispersed in the medium are sufficiently controlled; and is to provide a highly-sensitive tactile sensor with less variation in its characteristics even in the case of its miniaturization, manufactured by using the just-described material.

Further, another object of the present invention is to provide a manufacturing method of a material for tactile sensor, which is easy to be formed, and in which the shape, size and orientation of coils dispersed in the medium are sufficiently controlled.

Before describing the present invention, terms used herein will be defined.

A “spiral shape” is defined to be a shape of vortex spreading in a plane. While, a “helical shape” is defined to be a shape of spring stretching out into space. Further, a “coil plane” of a coil with spiral shape is defined as a plane in which the vortex shape of the coil spreads, and a “coil axis” is defined as a central axis of coil, perpendicular to the “coil plane”.

Further, a soft-magnetic material is defined as a magnetic material with small coercive force and high permeability, which can be used for forming, for example, a magnetic yoke and a magnetic shield of the head for magnetic recording. The layer formed of the soft-magnetic material has a higher magnetic-flux density due to taking the outer magnetic flux into itself, compared to its surround. While, a hard-magnetic material is defined as a magnetic material with large coercive force, which can be used for forming, for example, a permanent magnet. When being magnetized, the layer formed of the hard-magnetic material has magnetizations aligned (directed) magnetically along a magnetizing direction, in the normal use-environment of the sensor.

According to the present invention, a tactile-sensitive material is provided, which comprises a medium and a plurality of micro coils dispersed in the medium and constituting a LCR resonance circuit, and wherein each of the plurality of micro coils comprises at least one spiral coil portion, and coil axes of the plurality of micro coils are aligned (directed) along at least one direction and/or directed in at least one plane.

In the just-described tactile-sensitive material, each of the plurality of micro coils has a certain inductance (L) component, a certain capacitance (C) component and a certain resistance (R) component. Therefore, the plurality of micro coils dispersed in the medium constitutes an LCR resonance circuit in which these components are combined three-dimensionally. When a tactile stress generated from the contact with an outer object is applied to the tactile-sensitive material, the C component of the capacitor formed between the micro coils through the medium is varied significantly, which contributes to the improvement in sensitivity of the tactile sensor. In fact, the micro coils have a shape of flat plate in contrast to the carbon micro coil (CMC); therefore, they can easily construct a capacitor with a large C component through the medium. As a result, the larger amount of variation of the C component due to tactile stress can be obtained compared to the case of using the CMCs.

Further, as described above, because the coil axes of the micro coils are aligned (directed) along one direction and/or directed in one plane, facilitated is the modeling of the L, C and R components of the whole LCR resonance circuit. As a result, an advanced database of the patterns of sensor outputs can be constructed, which gives a lot of information about tactile stress and improves the sensitivity of the sensor.

In the tactile-sensitive material according to the present invention, each of the plurality of micro coils preferably comprises a core formed of a soft-magnetic material at the central position of the spiral coil portion. The core enables the L component of the micro coil to be larger, and thus enables the micro coil to be miniaturized. Further, the core enables an electric wave to be effectively absorbed, which contributes to the more improvement in sensitivity of the tactile sensor.

Further, all the coil axes of the plurality of micro coils are preferably aligned (directed) along one direction. And it is also preferable that the coil axes of the plurality of micro coils are aligned (directed) along one direction and directed in one plane perpendicular to the one direction, with a controlled ratio of aligned axes and directed axes. Furthermore, the coil axes of the plurality of micro coils are also preferably aligned (directed) along three directions orthogonal with one another, with a controlled ratio. By aligning/directing the coil axes, more facilitated is the modeling of the L, C and R components of the whole LCR resonance circuit. As a result, a more advanced database of the patterns of sensor outputs can be constructed.

Further, in the tactile-sensitive material according to the present invention, it is preferable that at least a part of each of the plurality of micro coils is formed of a hard-magnetic material, and is magnetized in a predetermined direction in each of the plurality of micro coils. In this case, all the magnetizations of the plurality of micro coils are preferably aligned (directed) along one direction. This configuration in which the magnetizations of the micro coils are magnetically aligned in the medium can cause an electric wave to be effectively absorbed under adjusting the position of the electrodes, which can improve the sensitivity of the tactile sensor. Here, it is also preferable that each of the plurality of micro coils has a double-layered structure of a coil base layer formed of a non-magnetic conductive material and a coil magnetization layer formed of a hard-magnetic material.

Further, in the tactile-sensitive material according to the present invention, each of the plurality of micro coils preferably comprises a plurality of spiral coil portions parallel with one another and sandwiching a dielectric layer therebetween. In this case, the micro coil has an excellently large C component; therefore, the variation of the C component due to tactile stress also becomes excellently large, which contributes to the improvement in sensitivity of the tactile sensor.

According to the present invention, a tactile sensor is further provided, which comprises: a tactile-sense part formed of a tactile-sensitive material; and at least a pair of electrodes provided so as to sandwich the tactile-sense part therebetween and electrically connected with the tactile-sense part, and wherein the tactile-sensitive material comprises a medium and a plurality of micro coils dispersed in the medium and constituting a LCR resonance circuit, each of the plurality of micro coils comprising at least one spiral coil portion, and coil axes of the plurality of micro coils, being aligned (directed) along at least one direction and/or directed in at least one plane.

In the just-described tactile sensor, two pairs of electrodes are preferably provided so as to sandwich the tactile-sense part therebetween in respective directions orthogonal with each other. And it is also preferable that three pairs of electrodes are provided so as to sandwich the tactile-sense part therebetween in respective directions orthogonal with one another. In either case, the sensor has high sensitivity with less variation of characteristics even in the case of miniaturized, and more information regarding tactile stress can be obtained.

According to the present invention, a manufacturing method of a tactile-sensitive material is further provided, which comprises the steps of: forming a plurality of micro coils, the micro coil having at least one spiral coil portion, and at least a part of the micro coil being formed of a hard-magnetic material; magnetizing each of the plurality of micro coils in a predetermined direction; adding and dispersing the plurality of micro coils in a medium; applying a predetermined direct-current magnetic field to the medium with the dispersed micro coils to align (direct) coil axes of the micro coils along one direction and/or to direct coil axes of the micro coils in one plane; and hardening the medium.

The just-described manufacturing method of the tactile sensor is easy to be performed, and, by using the manufacturing method, the shape and size of the micro coil to be dispersed in the medium can be sufficiently controlled.

In the manufacturing method according to the present invention, multiple kinds of the micro coils in which a relation between a direction of magnetization and a direction of coil axis is different among them are preferably added in the medium with a predetermined ratio. By this addition, the orientation of the coil axes of the micro coils dispersed in the medium can be controlled to be along at least one direction and/or in at least one plane.

That is, the coil axes of the plurality of micro coils are preferably aligned (directed) along one direction, and the coil axes of the plurality of micro coils are also preferably aligned (directed) along one direction and directed in one plane perpendicular to the one direction, with a predetermined ratio of aligned axes and directed axes. Further, it is also preferable that the coil axes of the plurality of micro coils are aligned (directed) along three directions orthogonal with one another, with a predetermined ratio.

Further, in the manufacturing method according to the present invention, it is further preferable that a coil base film made of a non-magnetic conductive material and a coil magnetization film made of a hard-magnetic material are deposited on a substrate; then, a plurality of micro coils each of which comprises at least one spiral coil portion is formed by etching; then, each of the plurality of micro coils is magnetized in a predetermined direction; and then, the plurality of micro coils is brought out from the substrate.

Further, preferably formed is a plurality of micro coils, each of the plurality of micro coils comprising a plurality of spiral coil portions parallel with one another and sandwiching a dielectric layer therebetween.

Further objects and advantages of the present invention will be apparent from the following description of preferred embodiments of the invention as illustrated in the accompanying figures. In each figure, the same element as an element shown in other figure is indicated by the same reference numeral. Further, the ratio of dimensions within an element and between elements becomes arbitrary for viewability.

BRIEF DESCRIPTION OF THE SEVERAL VIEWS OF THE DRAWINGS

FIGS. 2*b*-1 and 2*b*-2 show schematic views for explaining the coil axis and the direction of magnetization in a micro coil;

DETAILED DESCRIPTION OF THE INVENTION

Figure 1:
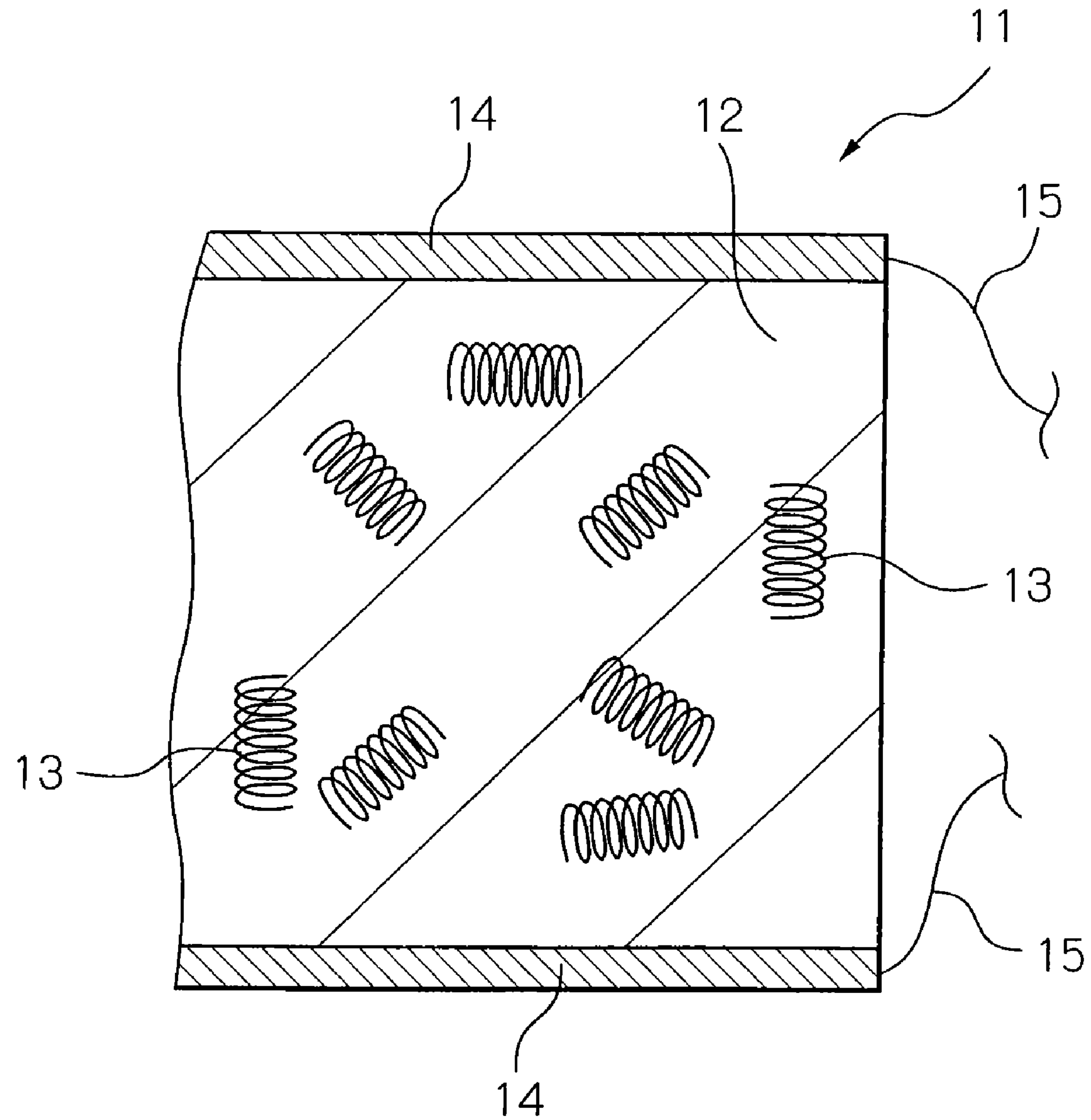
FIG. 1 shows a tactile sensor utilizing the CMCs described in Japanese Patent Publication No. 2005-49332A.
Figure 2A:
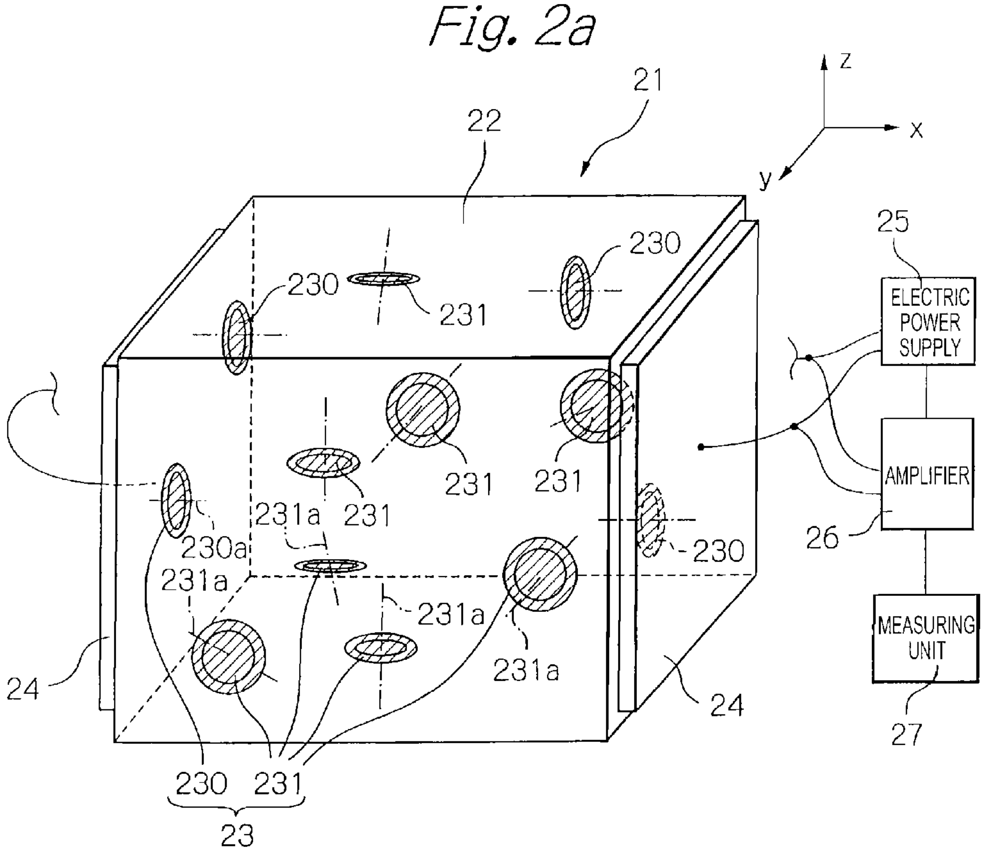
FIG. 2*a* shows a perspective view schematically illustrating the structure of one embodiment of the tactile sensor according to the present invention.
Figure 2B:
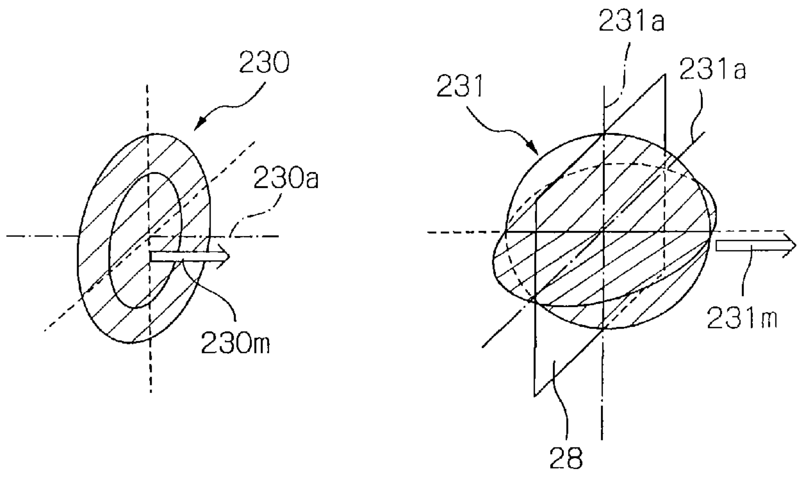

FIG. 2*a* shows a perspective view schematically illustrating the structure of one embodiment of the tactile sensor according to the present invention. And FIGS. 2*b*-1 and 2*b*-2 show schematic views for explaining the coil axis and the direction of magnetization in a micro coil. In these figures, x-, y-, and z-axis, which are orthogonal with one another, are defined in order to clarify directions.

As shown in FIG. 2*a*, a tactile sensor 21 includes: a medium 22 of rectangular solid; a plurality of micro coils 23 dispersed in the medium 22; and a pair of electrodes 24 provided respectively on both side surfaces opposed to each other along the x-axis of the medium 22. Here, the medium 22 with the dispersed micro coils 23 is considered as a tactile-sensitive material, or as a tactile-sense part formed of the material. In FIG. 2*a*, the number of the micro coils is extremely less than the real one, for viewability.

The medium 22 has certain elasticity, and certain conductivity lower than the micro-coil 23. Therefore, the medium 22 elastically supports a plurality of micro coils 23 in a dispersed state, and further electrically connects the micro coils and the micro coils, and the micro-coils and the electrodes 24. The medium 22 is formed of, for example, silicon resin, epoxy resin, polyamide resin, synthetic resin such as synthetic rubber, thermoplastic elastomer or the like, natural resin such as natural rubber, or a mixture of at least two of these resins. Further, the medium 22 may be formed of a material in which conductive particles such as metal particles or carbon particles are added and dispersed in one of these resins. In addition, the shape of the medium 22 is not limited to the rectangular solid, and may be cubic, discal, spherical or so. Further, the size of the medium 22 can be variously set according to its application; for example, the size of an edge or a diameter may be in the order of 100 nm (nanometers) to 10 cm (centimeters).

The micro coil 23 is a coil with spiral shape as described in detail later. The micro coils 23 are uniformly dispersed in the medium 22, and, are classified into: micro coils 230 in which a coil axis 230*a* is directed along the x-axis; and micro coils 231 in which a coil axis 231*a* is directed randomly in the yz plane which is a plane 28 perpendicular to the x-axis shown in FIG. 2*b*-2. The ratio of the numbers of micro coils 230 and micro coils 231 can be set arbitrarily; for example, be 1:2. In the present embodiment, the coil axis 230*a* is directed along the x-axis along which the electrodes 24 are opposed to each other; however, may be directed along the y- or z-axis, for example. In this case, the coil axis 231*a* is directed in the zx plane or in the xy plane.

At least a portion of each of micro coils 230 and 231 is formed of a hard-magnetic material in which the magnetizations are aligned (directed) along one direction, that is, magnetized. That is to say, the micro coils 230 and 231 are "magnetic micro coils", a portion of which has ferromagnetism. As shown in FIGS. 2*b*-1 and 2*b*-2, the micro coils 230 has a magnetization 230*m* parallel with the coil axis 230*a* (the x-axis), while the micro coils 231 has a magnetization 231*m* perpendicular to the yz plane 28 including the coil axis 231*a*, or parallel with the x-axis. Therefore, all the micro coils 23 in the medium 22 have magnetizations aligned (directed) along one direction (the x-axis in the present embodiment) This magnetization-aligned state can be realized by performing the process, during manufacturing the tactile-sensitive material, in which a direct-current magnetic field along the x-axis is applied to the medium 12 to orient the dispersed micro coils as described later. The configuration in which the magnetizations of the micro coils 23 are aligned in the medium 22 can cause an electric wave to be effectively absorbed under adjusting the position of the electrodes 24, which can improve the sensitivity of the tactile sensor 21.

Each of these micro coils 23 has a certain inductance (L) component, a certain capacitance (C) component and a certain resistance (R) component. Therefore, the plurality of micro coils 23 dispersed in the medium 22 constitutes an LCR resonance circuit in which these components are combined three-dimensionally. Further, the micro coil 23 has a shape of flat plate, and thus, considerable C components generated between the micro coils 23 through the medium 22 are also integrated into the LCR resonance circuit. The directions of vortex in the micro coils 230 (clockwise or counterclockwise) may be aligned in the medium 22 in order to control the characteristics of the LCR resonance circuit. In this aligned case, the magnetization 230*m* is set to be directed toward a direction in which a right-handed screw moves ahead when the screw is rotated in the direction of vortex motion of the micro coils 230, or is set to be directed toward the direction opposite to the moving-ahead direction. Here, the direction of vortex motion of the micro coils 230 is defined as a direction when going from the center of the vortex to the outer side.

In FIG. 2*a*, when a tactile stress generated from the contact with an outer object is applied to the tactile sensor 21, the positional relations and distances therebetween of the micro coils 23 supported elastically by the medium 22 are changed, and the shapes and directions of respective micro coils 23 are also varied. The tactile stress may be applied to the surface with no electrode 25 of the sensor, or may be applied through the electrode 25. The tactile stress causes the micro coils 23 to be deformed, and thus, the generated distortion within the micro coil 23 varies the R component. Further, the positional relation between the deformed micro coils 23 and the medium 22 is changed, which varies the L and C components. According to these variations of the components, varied are the electromagnetic characteristics of the whole LCR resonance circuit. Especially, the C component of the capacitor formed between the micro coils 23 through the medium 22 is varied significantly, which contributes to the improvement in sensitivity of the tactile sensor. In fact, the micro coils 23 have a shape of flat plate in contrast to the carbon micro coil (CMC); therefore, they can easily construct a capacitor with a large C component through the medium 22. As a result, the larger amount of variation of the C component due to tactile stress can be obtained compared to the case of using the CMCs.

Further, as described above, because the coil axes of the micro coils 23 are aligned along the x-axis direction and directed in the yz plane with a controlled ratio of aligned axes and directed axes, facilitated is the modeling of the L, C and R components of the whole LCR resonance circuit. As a result, an advanced database of the patterns of sensor outputs can be constructed, which gives a lot of information about tactile stress and improves the sensitivity of the sensor. Alternatives in which the coil axes of the micro coils 23 are aligned along one direction and/or directed in one plane with a controlled ratio of aligned axes and directed axes can also have such an effect as the just-described.

A pair of electrodes 24 is provided for detecting the above-described variation of the characteristics due to tactile stress of the LCR resonance circuit as the variation of the L, C and R components or the variation of the resonance frequency of the whole circuit. The electrodes 24 are formed of, for example, a metal such as Cu, or a conductive material in which conductive particles such as metal particles or carbon particles are added and dispersed into elastic synthetic rubber or thermoplastic elastomer. A predetermined voltage is applied between the electrodes 24 by an electric power supply 25; then, a predetermined current flows or a predetermined electromagnetic wave is irradiated in the medium 22. The current may be a direct current or an alternate current. The frequency of the current or electromagnetic wave is, for example, in the range of 10 kHz to 1 MHz. The amplifier 26 is provided for receiving the variation in voltage or the like due to tactile stress of the LCR resonance circuit through the electrodes 24 and amplifying the variation signal to the degree that a measuring unit 27 can detect and measure the signal. The variation in voltage to be detected of the LCR resonance circuit is, for example, in the order of 1 μV (microvolt); therefore, used is the amplifier by which such a small variation in voltage can be amplified. The measuring unit 27 preferably has a function for analyzing impedance.

Figure 3:
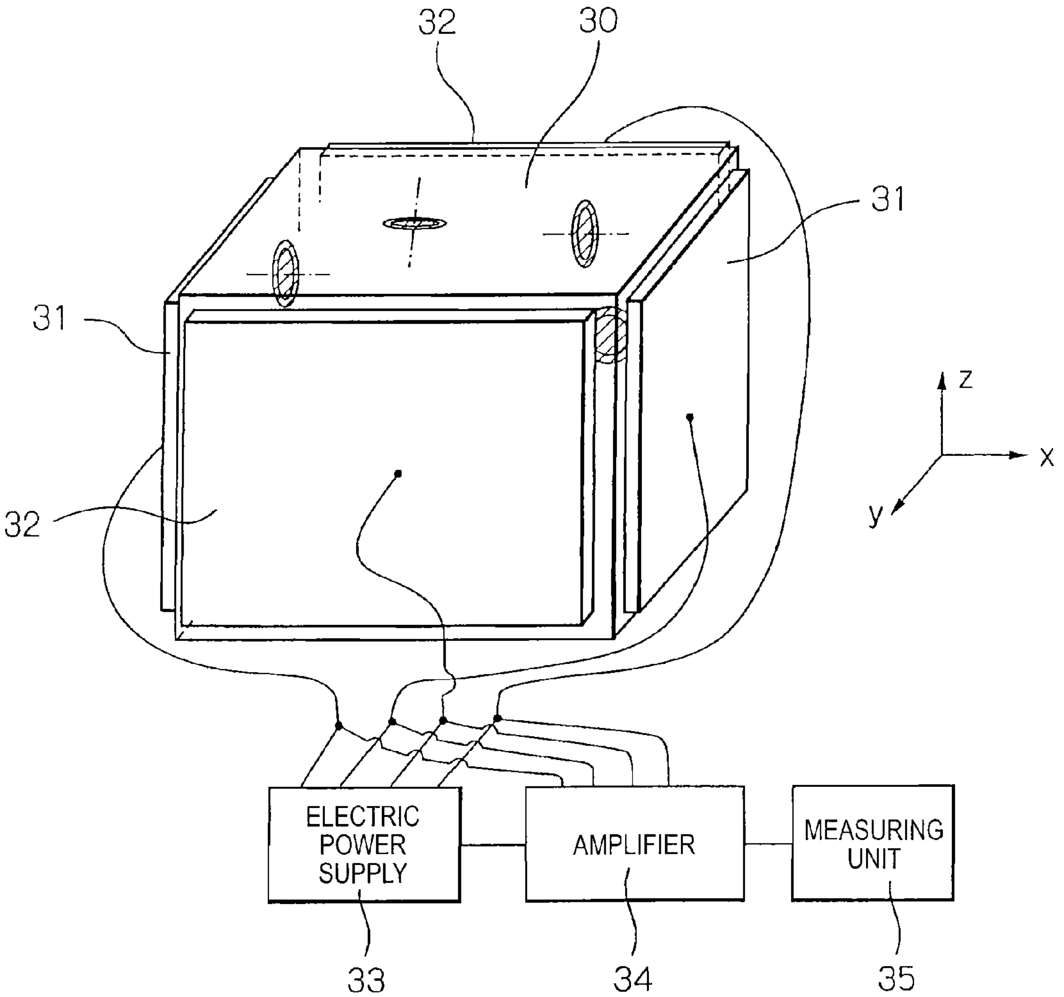
FIG. 3 shows a perspective view schematically illustrating an alternative regarding the electrodes in the tactile sensor according to the present invention.

FIG. 3 shows a perspective view schematically illustrating an alternative regarding the electrodes in the tactile sensor according to the present invention.

As shown in FIG. 3, in a medium 30 with dispersed micro coils, a pair of electrodes 31 and a pair of electrodes 32 are provided on both side surfaces opposed to each other in the x-axis direction and on both side surfaces opposed to each other in the y-axis direction, respectively. A predetermined voltage is applied between the electrodes 31 and between the electrodes 32, or between either pair of electrodes, by an electric power supply 33; then, a predetermined current flows or a predetermined electromagnetic wave is irradiated in the medium 30. The amplifier 34 is provided for receiving the variation in voltage or the like due to tactile stress of the LCR resonance circuit through the electrodes 31 and 32 and for amplifying the variation signal to the degree that a measuring unit 35 can detect and measure the signal.

In the present alternative, because the variation of the L, C and R components or the variation of the resonance frequency of the whole LCR resonance circuit is detected with two pairs of the electrodes 31 and 32, more information regarding tactile stress can be obtained. In addition, in the case that the electrodes have elasticity and thus a tactile stress can be measured through the electrode, it is possible that electrodes are further provided respectively on both side surfaces opposed to each other in the z-axis direction, and the variation in voltage or the like due to tactile stress of the LCR resonance circuit is detected three-dimensionally in the form of the electrodes surrounding the medium 30.

Figure 4A:
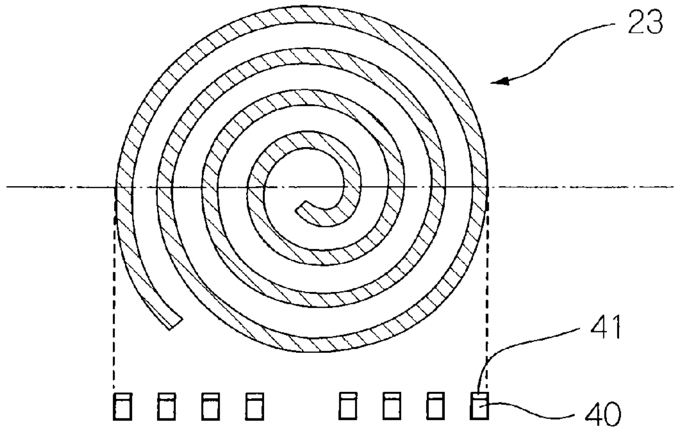
FIGS. 4*a* to 4*c* show schematic views illustrating various embodiments of micro coils in the tactile sensor according to the present invention.
Figure 4B:
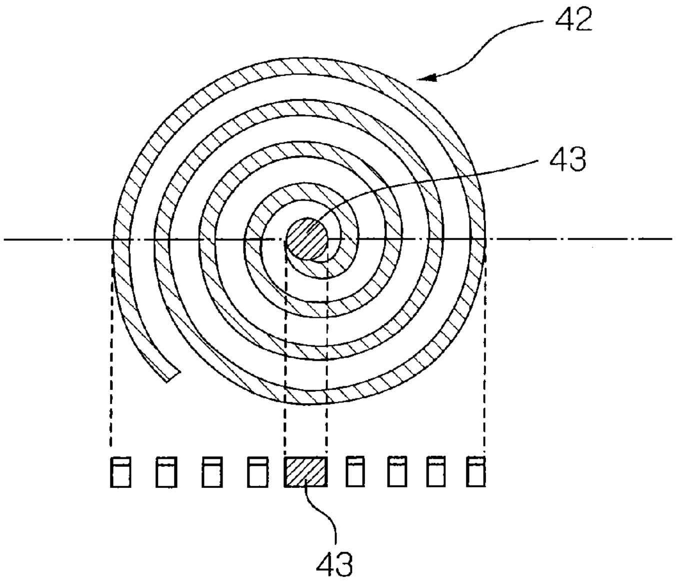
Figure 4C:
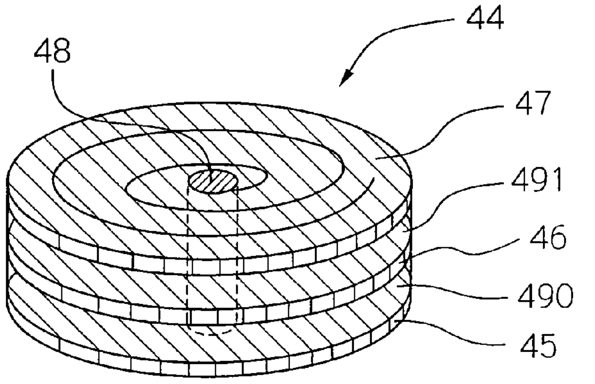

FIGS. 4*a* to 4*c* show schematic views illustrating various embodiments of micro coils in the tactile sensor according to the present invention.

As shown in FIG. 4*a*, the micro coil 23 has a spiral shape. The coil diameter of the micro coil 23 is, for example, in the range of approximately 10 nm to 1 cm, and its thickness is, for example, in the range of approximately 1 nm to 100 μm (micrometers). In the present embodiment, the micro coil 23 has a double-layered structure of: a coil base layer 40 formed of a non-magnetic conductive material such as Cu, Au or Al; and a coil magnetization layer 41 formed of a hard-magnetic material such as CoPt, CoFe, CoCrPt or a ferrite, that is to say, the micro coil 23 is a "magnetic micro coil" a part of which has ferromagnetism. The magnetization of the coil magnetization layer 41 may be set to be directed perpendicular to the coil plane, or may be set to be directed toward one direction in the coil plane, as shown in FIGS. 2*b*-1 and 2*b*-2. The thickness of the coil magnetization layer 41 is, for example, in the range of approximately 0.5 nm to 10 μm. The planar shape of the micro coil 23 is not limited to circular, and may be, for example, elliptical or rectangular. In either case, the micro coil has a planar shape by which the L, C and R components of the coil is varied due to the deformation by an outer force and the more amount of planar area are occupied compared to a CMC with the same size. The more amount of occupied area in the micro coil 23 enables micro coils 23 opposed to each other through the medium to have a larger C component. Alternatively, the micro coil 23 may have a single-layer structure of the coil magnetization layer. In this case, the coil magnetization layer is preferably formed of a hard-magnetic conductive material.

As shown in FIG. 4*b*, a micro coil 42 is provided with a core 43 at the central portion of the coil. In the present embodiment, the core 43 is connected with the spiral coil portion. The core 43 is formed of, for example, a soft-magnetic material with high permeability such as NiFe (Permalloy), and acts as a magnetic core of the coil. The core 43 enables the L component of the micro coil 42 to be larger, and thus enables the micro coil 42 to be miniaturized. Further, the core 43 enables an electric wave to be effectively absorbed, which contributes to the improvement in sensitivity of the tactile sensor.

As shown in FIG. 4*c*, a micro coil 44 has a three-layered structure in which three spiral coil portions 45, 46 and 47 are stacked parallel with one another. Dielectric layers 490 and 491, which are formed of a resin such as resist or an insulating material such as $Al_2O_3$ or $SiO_2$, are sandwiched respectively between the coil portions 45 and 46 and between the coil portions 46 and 47. Here, at least one of the spiral coil portions 45, 46 and 47 preferably has a double-layered structure of the coil base layer and the coil magnetization layer as shown in FIG. 4*a*, or also preferably has a monolayer structure of the coil magnetization layer. In the above-described structures, the micro coil 44 has an excellently large C component; therefore, the variation of the C component due to tactile stress also becomes excellently large, which contributes to the improvement in sensitivity of the tactile sensor.

Further, as shown in FIG. 4*c*, the micro coil 44 is provided with a core 48 formed of, for example, a soft-magnetic material with high permeability such as NiFe (Permalloy). The core 48 may be a part penetrating though the spiral coil portions 45, 46 and 47, or may be parts provided separately in each layer of the spiral coil portions. The core 48 enables the L component of the micro coil 44 to be sufficiently larger, and thus enables the micro coil 44 to have smaller diameter. Further, the core 48 enables an electric wave to be effectively absorbed, which contributes to the improvement in sensitivity of the tactile sensor. The number of stacked coil portions in the micro coil is not limited to three, and may be two or may be four or more.

Figure 5A:
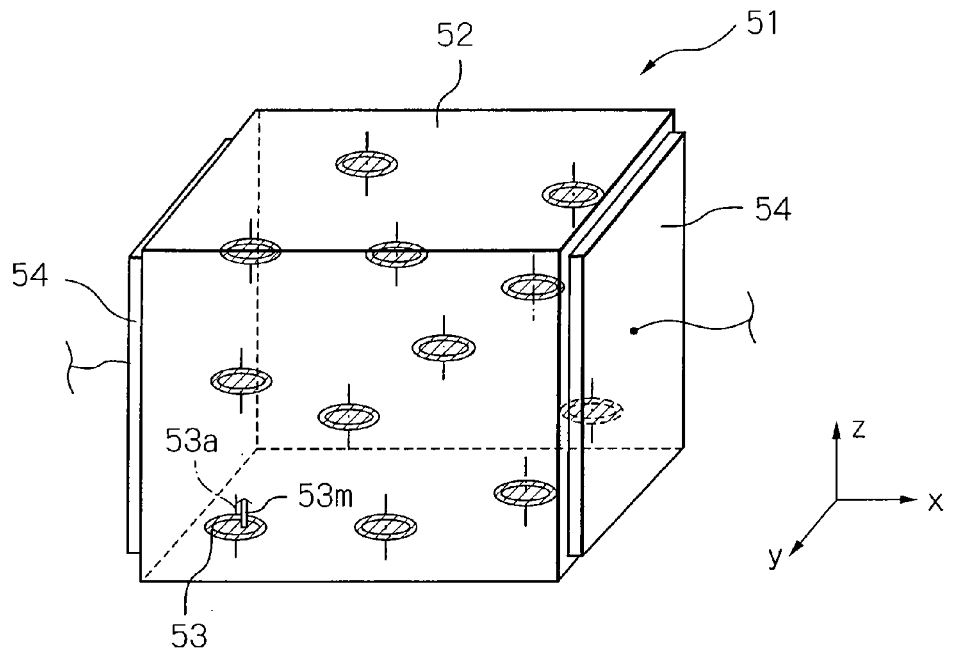
FIGS. 5*a* and 5*b* show perspective views illustrating alternatives regarding the orientation of micro coils in the tactile sensor according to the present invention.
Figure 5B:
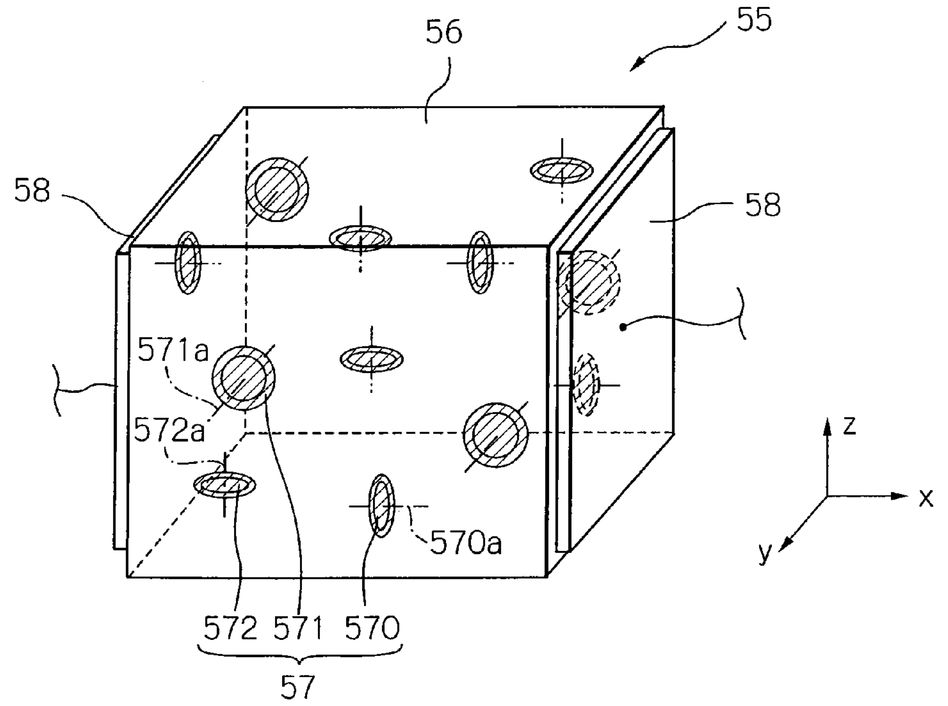

FIGS. 5*a* and 5*b* show perspective views illustrating alternatives regarding the orientation of micro coils in the tactile sensor according to the present invention.

As shown in FIG. 5*a*, in a tactile sensor 51, all the coil axes 53*a* of a plurality of micro coils 53 dispersed in the medium 52 are aligned along one direction (the z-axis direction). Or all the coil axes 53*a* may be aligned along the direction (the x-axis direction) in which the electrodes 54 are opposed to each other. In the case that the magnetizations 53*m* of the micro coils 53 are directed to the direction of the coil axes 53*a*, the orientation of the coil axes 53*a* is facilitated by applying a direct-current magnetic field.

In a tactile sensor 55 shown in FIG. 5*b*, a plurality of micro coils 57 dispersed in the medium 56 is classified into three kinds of coils with regard to the orientation of coil axis: micro coils 570, 571 and 572. The micro coils 570, 571 and 572 have coil axes 570*a* aligned along the x-axis direction, coil axes 571*a* aligned along the y-axis direction, and coil axes 572*a* aligned along the z-axis direction. Further, the ratio of the numbers of micro coils 570, 571 and 572 is controlled; and is, for example, be 1:1:1.

In the tactile sensors 51 and 55, because the coil axes are aligned with a controlled ratio, facilitated is the modeling of the L, C and R components of the whole LCR resonance circuit. As a result, an advanced database of the patterns of sensor outputs can be constructed, which gives a lot of information about tactile stress and improves sensitivity of the sensor.

FIGS. 6*a* to 6*h* shows a schematic view illustrating one embodiment of the forming method of the micro coils using for manufacturing the tactile-sensitive material according to the present invention.

Figure 6A:
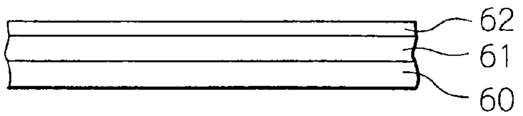
FIGS. 6*a* to 6*h* shows a schematic view illustrating one embodiment of the forming method of the micro coils using for manufacturing the tactile-sensitive material according to the present invention.

As shown in FIG. 6*a*, first, a base film 61 made of, for example, $Al_2O_3$ is deposited with thickness of, for example, approximately 5 μm on a substrate 60 made of, for example, Si (silicon) or $Al_2O_3$—TiC (AlTiC) by using, for example, a sputtering method or a plating method. Next, a core film 62 made of, for example, a soft-magnetic material such as NiFe (Permalloy) is deposited with thickness of, for example, approximately 2 μm on the base film 61 by using, for example, a sputtering method or a plating method.

Figure 6B:
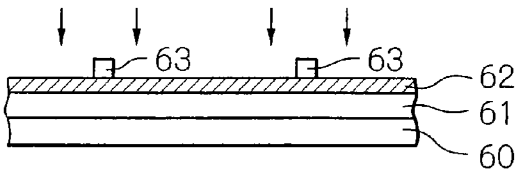
Figure 6C:
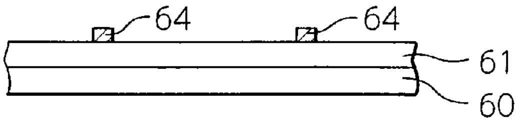

After that, as shown in FIG. 6*b*, resist mask layers 63 for forming cores are formed on positions to be the center of spiral shape of the micro coil, by using, for example, a photolithography method. Then, portions that are not masked by the resist mask layers 63 are etched by using, for example, an ion milling method or a reactive ion etching (RIE) method. Then, as shown in FIG. 6*c*, cores 64 are formed after removing the resist mask layers 63 with a remover or the like.

Figure 6D:
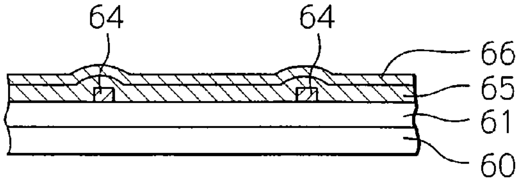

Next, as shown in FIG. 6*d*, a coil base film 65 made of, for example, a non-magnetic conductive material such as Cu, Au or Al is deposited with thickness of, for example, approximately 2 μm so as to cover the formed cores 64 by using, for example, a sputtering method or a plating method. Further, a coil magnetization film 66 made of, for example, a hard-magnetic material such as CoPt, CoFe, CoCrPt or a ferrite is deposited with thickness of, for example, approximately 0.1 μm on the coil base film 65 by using, for example, a sputtering method or a plating method.

Figure 6E:
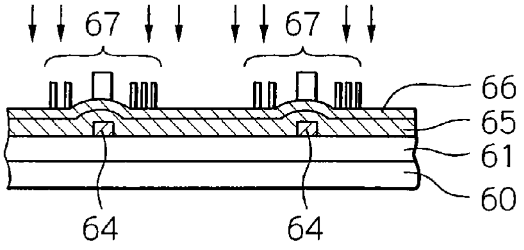
Figure 6F:
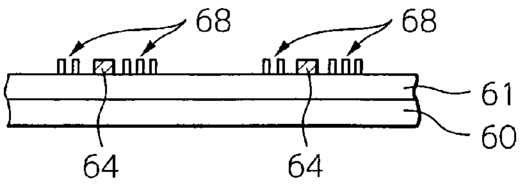

After that, as shown in FIG. 6*e*, resist mask layers 67 for forming spiral coil portions are formed so as to cover the cores 64 by using, for example, a photolithography method. Then, portions that are not masked by the resist mask layers 67 are etched by using, for example, an ion milling method or a RIE method. Then, as shown in FIG. 6*f*, spiral coil portions 68 are formed after removing the resist mask layers 67 with a remover or the like.

Figure 6G:
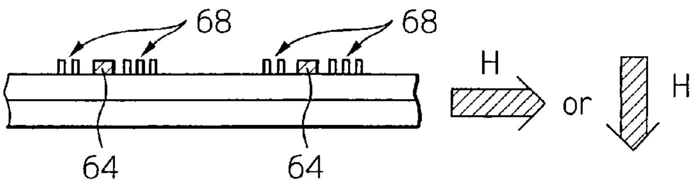
Figure 6H:
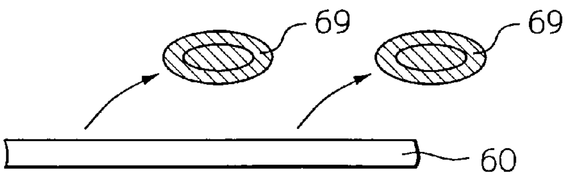

Next, as shown in FIG. 6*g*, a direct-current magnetic field with intensity of approximately 8 kOe (approximately 640 kA/m) is applied to the whole spiral coil portions 68 to magnetize the portions 68 (to align the magnetizations of the spiral coil portions 68). In the application of the direct-current magnetic field, by choosing whether applied is a magnetic field perpendicular to the stacking surface of the substrate 60 or a magnetic field directed in plane of the stacking surface, two kinds of (magnetic) micro coils 230 and 231 shown in FIGS. 2*b*-1 and 2*b*-2 can be formed respectively.

After that, the substrate 60, on which the cores 64 and the spiral coil portions 68 are formed, is dipped in, for example, NaOH (sodium hydroxide) solution, and thus, micro coils 69 are separated off from the substrate 60 by dissolving the base film 61 made of, for example, $Al_2O_3$. At last, the micro coils 69 brought out into the solution are gathered by using a filter or by applying a magnetic field.

The above-explained forming method of the micro coils for the tactile sensor according to the present invention is not limited to the embodiment described above. The micro coil with no core as shown in FIG. 4*a* can be formed as follows: the forming process of the cores shown in FIGS. 6*a* to 6*c* is skipped; the coil base film 65 and the coil magnetization film 66 are deposited on the base film 61 formed on the substrate 60; and then, the same steps as those shown in FIGS. 6*e* to 6*h* is preformed. Further, it is understood that the micro coils as shown in FIG. 4*c* in which a plurality of spiral coil portions are stacked can be formed by repeating the forming steps of the cores and the spiral coil portions shown in FIGS. 6*a* to 6*f*, and by inserting respective forming steps of the dielectric layers 490 and 491 among the forming steps of the cores and the spiral coil portions.

Figure 7:
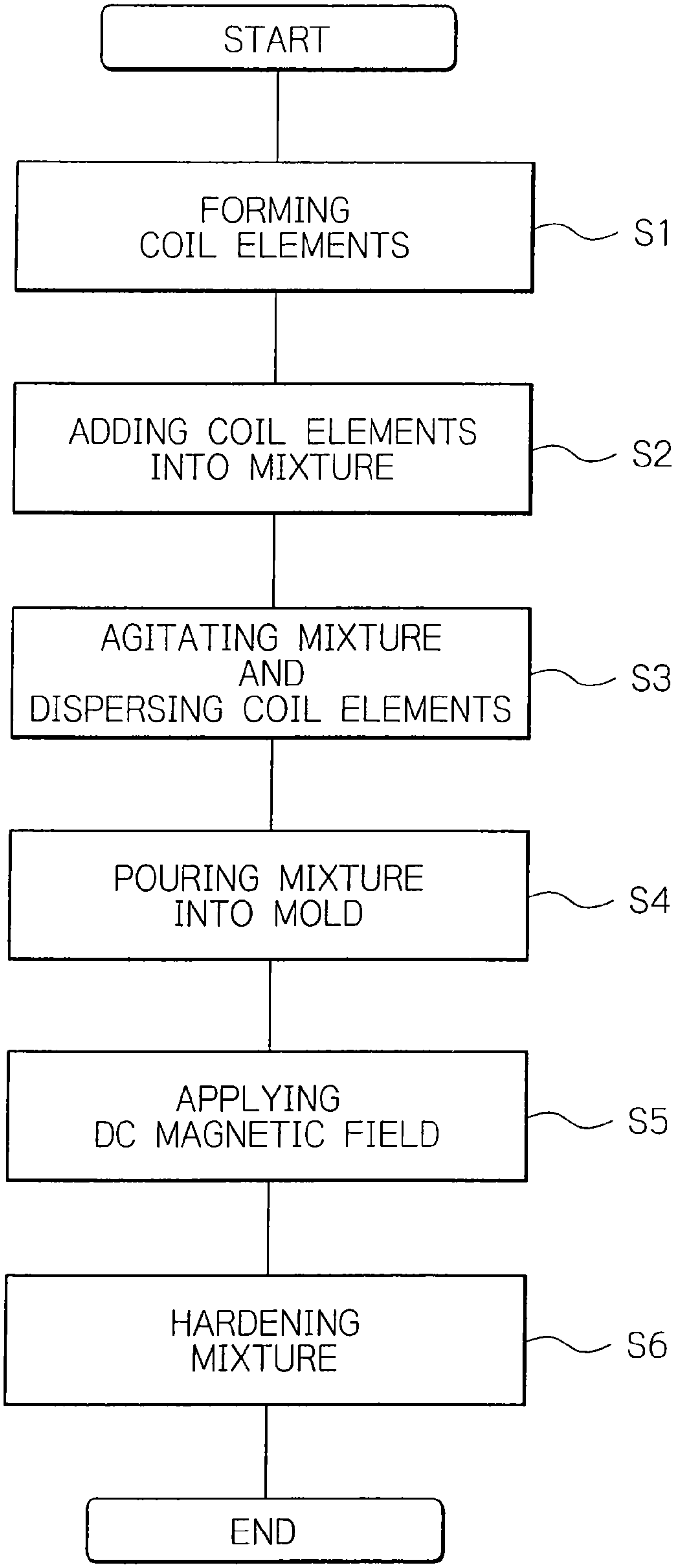
FIG. 7 shows a flowchart illustrating one embodiment of the manufacturing method of the tactile-sensitive material according to the present invention.

FIG. 7 shows a flowchart illustrating one embodiment of the manufacturing method of the tactile-sensitive material according to the present invention.

As shown in FIG. 7, first, a plurality of coil elements (micro coils) is formed (step S1). The micro coil has at least one spiral coil portion; at least a part of the micro coil is formed of a hard-magnetic material; and the micro coil can be formed by using or applying the above-described forming method explained with FIGS. 6*a* to 6*h*. Here, for example, formed are two kinds of micro coils 230 and 231 shown in FIGS. 2*b*-1 and 2*b*-2.

Next, the micro coils (coil elements), the number of which is equivalent to the weight of, for example, approximately 0.1 to 10 wt. % (percent by weight), are added into a mixture of, for example, a base material of silicon resin and a hardening agent (step S2). The ratio of the numbers of the formed micro coils 230 and 231 may be controlled with a predetermined rate, for example, 1:2. Then, the mixture is agitated by, for example, a centrifugal machine to disperse the micro coils, and then, is defoamed (step S3). After that, the mixture with the dispersed micro coils (coil elements) is poured into a mold (step S4).

Then, a direct-current magnetic field with intensity of, for example, approximately 500 Oe (approximately 40 kA/m) is applied to the whole mixture poured into the mold in a predetermined direction, to align the magnetizations of the dispersed (magnetic) micro coils (step S5). Here, in the case that, for example, the micro coils 230 and 231 are added with a ratio of, for example, 1:2, the ratio of: the number of the micro coils 230 having coil axes aligned along the direction of the applied direct-current field; and the number of the micro coils 231 having coil axes directed in plane perpendicular to the applied direct-current field, can be controlled into 1:2, as shown in FIG. 2*a*. That is, by adjusting the ratio of the numbers of respective kinds of micro coils added into the mixture, the ratio in the orientation of the coil axes can be controlled. The applied direct-current magnetic field is required to have an intensity by which generated are the moments which can change the direction of each of the dispersed micro coils in the non-hardened mixture.

After that, keeping on applying the direct-current field to maintain the orientation of the magnetizations of the micro coils, the mixture is hardened by leaving it at, for example, room temperature for several hours (step S6). At last, the hardened mixture is brought out from the mold, and ended is the manufacturing of the tactile-sensitive material.

The above-explained manufacturing method of the tactile sensor is easy to be performed, compared to that of the tactile sensor with the CMCs. Further, by using the manufacturing method, the shape and size of the micro coil to be dispersed in the medium can be sufficiently controlled with high accuracy of the photolithography method. Further, the orientation of the micro coils in the medium can be also sufficiently controlled by applying a direct-current magnetic field because the micro coil is a spiral coil with shape of flat plate in contrast to the CMC.

All the foregoing embodiments are by way of example of the present invention only and not intended to be limiting, and many widely different alternations and modifications of the present invention may be constructed without departing from the spirit and scope of the present invention. Actually, the tactile-sensitive material according to the present invention can be used as a material not only for the tactile sensor, but also for an electric-wave absorber, an artificial skin, a pressure sensor, stress sensor or the like. Accordingly, the present invention is limited only as defined in the following claims and equivalents thereto.

The invention claimed is:

1. A manufacturing method of a tactile-sensitive material comprising the steps of:

forming a plurality of micro coils, each of said plurality of micro coils having at least one spiral coil portion, and at least a part of the micro coil being formed of a hard-magnetic material;

magnetizing each of said plurality of micro coils in a predetermined direction;

adding and dispersing said plurality of micro coils in a medium;

applying a predetermined direct-current magnetic field to said medium with the dispersed micro coils to align coil axes of the micro coils along one direction or to direct coil axes of the micro coils in one plane; and hardening said medium.

2. The manufacturing method as claimed in claim 1, wherein multiple kinds of the micro coils in which a relation between a direction of magnetization and a direction of coil axis is different among them are added in said medium with a predetermined ratio.

3. The manufacturing method as claimed in claim 1, wherein the coil axes of said plurality of micro coils are aligned along one direction.

4. The manufacturing method as claimed in claim 1, wherein the coil axes of said plurality of micro coils are aligned along one direction and directed in one plane perpendicular to said one direction, with a predetermined ratio of aligned axes and directed axes.

5. The manufacturing method as claimed in claim 1, wherein the coil axes of said plurality of micro coils are aligned along three directions orthogonal with one another, with a predetermined ratio.

6. The manufacturing method as claimed in claim 1, wherein the step of forming the plurality of micro coils comprises depositing a coil base film made of a non-magnetic conductive material and a coil magnetization film made of a hard-magnetic material on a substrate before the plurality of micro coils is formed by etching, so that said plurality of micro coils is brought out from said substrate.

7. The manufacturing method as claimed in claim 1, wherein each of said plurality of micro coils comprising a plurality of spiral coil portions parallel with one another and sandwiching a dielectric layer therebetween.

* * * * *